United States Patent
Kim et al.

(10) Patent No.: US 10,525,528 B2
(45) Date of Patent: Jan. 7, 2020

(54) ALUMINUM ALLOY FOR DIE-CASTING, HAVING IMPROVED CORROSION RESISTANCE

(71) Applicant: KMW INC., Hwaseong-si (KR)

(72) Inventors: Yoon-Yong Kim, Yongin-si (KR); Chang-Woo Yoo, Suwon-si (KR)

(73) Assignee: KMW INC., Hwaseong-si (KR)

( * ) Notice: Subject to any disclaimer, the term of this patent is extended or adjusted under 35 U.S.C. 154(b) by 131 days.

(21) Appl. No.: 15/581,193

(22) Filed: Apr. 28, 2017

(65) Prior Publication Data

US 2017/0252800 A1 Sep. 7, 2017

Related U.S. Application Data

(63) Continuation of application No. PCT/KR2015/010105, filed on Sep. 24, 2015.

(30) Foreign Application Priority Data

Oct. 29, 2014 (KR) .................. 10-2014-0148224

(51) Int. Cl.
| | |
|---|---|
| *C22C 21/08* | (2006.01) |
| *B22D 25/02* | (2006.01) |
| *B22D 21/00* | (2006.01) |
| *H03H 2/00* | (2006.01) |

(52) U.S. Cl.
CPC .......... *B22D 25/02* (2013.01); *B22D 21/007* (2013.01); *C22C 21/08* (2013.01); *H03H 2/005* (2013.01)

(58) Field of Classification Search
CPC ........ C22C 21/08; B22D 25/02; B22D 21/007
See application file for complete search history.

(56) References Cited

U.S. PATENT DOCUMENTS

2010/0074796 A1* 3/2010 Franke ................ C22F 1/05
420/535

FOREIGN PATENT DOCUMENTS

| JP | 08-035029 A | 2/1996 |
|---|---|---|
| JP | 3107517 B | 9/2000 |
| JP | 2005-226161 A | 8/2005 |
| KR | 10-2011-0113454 A | 10/2011 |
| KR | 10-2012-0081553 A | 7/2012 |
| KR | 10-2012-0084640 A | 7/2012 |
| KR | 10-2012-0130114 A | 11/2012 |

OTHER PUBLICATIONS

International Search Report for PCT/KR2015/010105 dated Nov. 11, 2015 and English translation thereof.
Office Action dated Apr. 3, 2018 for Chinese Application No. 201580059267.0 and its English Translation.

* cited by examiner

*Primary Examiner* — George Wyszomierski
*Assistant Examiner* — Janell C Morillo

(57) ABSTRACT

An aluminum alloy includes 6 to 8.5 wt % of magnesium (Mg), 4 to 6 wt % of silicon (Si), 0.4 to 0.8 wt % of iron (Fe), 0.2 to 0.5 wt % of manganese (Mn), 0.01 to 0.1 wt % of copper (Cu), 0.05 to 0.15 wt % of titanium (Ti), and the remainder being aluminum (Al), and may be in use for die-casting electronic components or communication components which require weight reduction and high corrosion resistance.

3 Claims, 5 Drawing Sheets
(4 of 5 Drawing Sheet(s) Filed in Color)

ALUMINUM ALLOY FOR DIE-CASTING, HAVING IMPROVED CORROSION RESISTANCE

CROSS REFERENCE TO RELATED APPLICATIONS

This application is a continuation of an International Application No. PCT/KR2015/010105, which claims priority to Korean Patent Application No. 10-2014-0148224 filed on Oct. 29, 2014, the entire disclosures of which are incorporated herein by reference.

TECHNICAL FIELD

The present invention relates to an aluminum alloy having improved corrosion resistance, for die casting, and more particularly, to an aluminum alloy having excellent corrosion resistance, which is composed suitably for die casting by mixing aluminum with various alloy elements of specific compositions.

BACKGROUND ART

In general, aluminum is widely used in a variety of industrial fields because aluminum is lightweight, easily cast, easily alloyed with other metals, easily machined at room temperature and high temperature, and has good electrical and thermal conductivity. Especially, aluminum alloys formed by mixing aluminum with other metals have recently become popular in cars and electronic goods, for the purpose of high fuel efficiency or weight reduction.

Typically, a product is fabricated of an aluminum alloy by forming a case through press molding and forming an anodic oxide film on the surface of the case. According to this method, the case has a surface durable over a long term and a sophisticated color, but its design is limited because there are shapes not available by press molding.

Accordingly, die casting is widely used to fabricate a product of an aluminum alloy. Die casting is a fine casting process in which a die cast identical to a mold machined precisely into the shape of a required cast is achieved by forcing a molten metal into the mold. Since products fabricated by die casting have precise dimensions, need no finishing, exhibit excellent mechanical properties, allow mass production, and require low production cost, die casting is most popular with high mass productivity, in various fields including vehicle parts, electrical devices, optical devices, and meters.

At present, Al—Si series of alloys including ALDC3, ALDC10, and ALDC12, and Al—Mg series of alloys including ALDC5 or ALDC6, which have high die castability, are used widely as aluminum alloys for die casting. However, because these die-casting aluminum materials exhibit poor corrosion resistance, they have limitations in their use in a wide range of applications. Although the poor corrosion resistance may be improved by forming a protection film on the surface of an alloy by physical deposition using an expensive vacuum equipment, a shortcoming of this method is that an additional expensive equipment is required and may not be reused. An ion injection technique of injecting ions of a corrosion-resistant element into the surface of an alloy, and a laser annealing technique of rendering a surface layer to be in a quasi-stable state by projecting a laser beam onto the surface of an alloy are also available. However, the former has a limit on an ion injection depth, and thus if an ion injection layer is damaged during use, corrosion resistance is rapidly decreased. In the latter, the size of a product is changed during processing, which requires additional machine processing.

Accordingly, there is a need for developing a new aluminum alloy for die casting, which is lightweight and durable, facilitates molding of products in various shapes, and has more excellent corrosion resistance than a conventional aluminum alloy even without post-processing of the surface of a product.

In this context, the present inventor completed the present invention by discovering an alloy composition and an optimal composition ratio which can improve corrosion resistance and significantly reduce the weight of a molded product without the need for additional surface processing such as conventional anodizing, compared to a conventional die-casting aluminum alloy, as a result of making efforts to develop a method for reducing the weight of an aluminum alloy and improving the corrosion resistance of the aluminum alloy, while maintaining the properties of the aluminum alloy in view of the characteristics of each component, by mixing pure aluminum with various alloy elements such as Si, Fe, Cu, Mn, Mg, Cr, Ni, Zn, Ti, Pb, Be, Co, and Sn in predetermined amounts.

SUMMARY

The present invention has been made in view of the above-mentioned problems, and an aspect of various embodiments the present invention is to provide an aluminum alloy for die casing, which has improved corrosion resistance without the need for additional surface processing by alloying Al with Mg, Si, Fe, Mn, Cu, and Ti.

Another aspect of various embodiments of the present invention is to provide an aluminum alloy for die casting, for fabrication of an electronic or communication device that requires both light weight and high corrosion resistance for a product.

In an aspect of the present invention, an aluminum alloy having improved corrosion resistance, for die casting, contains 6 to 8.5 wt. % by weight of magnesium (Mg), 4 to 6% by weight of silicon (Si), 0.4 to 0.8% by weight of iron (Fe), 0.2 to 0.5% by weight of manganese (Mn), 0.01 to 0.1% by weight of copper (Cu), 0.05 to 0.15% by weight of titanium (Ti), and remaining aluminum (Al).

The aluminum alloy may further contain at least one selected from a group consisting of beryllium (Be) and cobalt (Co) at 0.001 to 0.01% by weight.

In another aspect of the present invention, a frequency filter (case) fabricated with the aluminum alloy for die casting is provided.

In another aspect of the present invention, a method for fabricating a part of a communication device, having improved corrosion resistance includes producing an ingot containing 6 to 8.5% by weight of magnesium (Mg), 4 to 6% by weight of silicon (Si), 0.4 to 0.8% by weight of iron (Fe), 0.2 to 0.5% by weight of manganese (Mn), 0.01 to 0.1% by weight of copper (Cu), 0.05 to 0.15% by weight of titanium (Ti), and remaining aluminum (Al), melting the ingot into a molten metal, and fabricating a molded product with the molten metal, using a die-casting mold.

An aluminum alloy for die casting according to the present invention is composed of 6 to 8.5% by weight of magnesium (Mg), 4 to 6% by weight of silicon (Si), 0.4 to 0.8% by weight of iron (Fe), 0.2 to 0.5% by weight of manganese (Mn), 0.01 to 0.1% by weight of copper (Cu), 0.05 to 0.15% by weight of titanium (Ti), and remaining aluminum (Al). Therefore, while maintaining properties similar to those of conventional aluminum alloys, the aluminum alloy is more lightweight than conventional products due to a relatively low weight, and exhibits excellent corrosion resistance without the need for an additional surface process. As a consequence, the aluminum alloy may be used for die casting to fabricate parts of an aircraft, a train, a vehicle, or an electronic or communication device, which requires lightweight and high corrosion resistance with low cost.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Figure 1A:
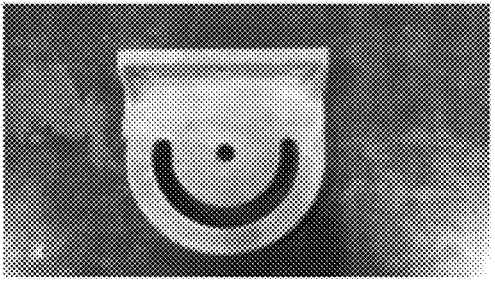
FIG. 1A illustrates pictures of surface changes of a specimen fabricated according to the present invention, measured after 120 hours, 264 hours, 576 hours, and 774 hours with no surface processing under the conditions of a salt water spray test.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the present invention, are described in more detail. However, as it is presented as an example, the present invention is not limited thereto and the present invention is defined only by the scope of the claims which will be described later.

An aluminum alloy for die casting according to the present invention contains 6 to 8.5% by weight of magnesium (Mg), 4 to 6% by weight of silicon (Si), 0.4 to 0.8% by weight of iron (Fe), 0.2 to 0.5% by weight of manganese (Mn), 0.01 to 0.1% by weight of copper (Cu), 0.05 to 0.15% by weight of titanium (Ti), and remaining aluminum (Al).

The aluminum alloy may contain an infinitesimal amount of incidental impurities. Available incidental impurities may include, but not limited to, B, Cr, Sn, Sr, Pb, Zn, Ni, Cd, Ag, Zr, Ca, other transition metals, and other rare earth elements. Although various impurities may exist during each casting, their presence does not affect the present invention. Preferably, the total amount of impurities may be below 0.01% by weight.

The aluminum alloy for die casting according to the present invention contains 6 to 8.5% by weight of Mg. The Mg component advantageously increases tensile strength and is more lightweight than Si, which facilitates fabrication of a lightweight product. If the content of Mg is less than 6% by weight, the effect of increasing tensile strength may not be achieved. If the content of Mg exceeds 8.5% by weight, corrosion resistance is decreased and a molten metal gets more sticky. The resulting decrease of fluidity leads to decreased workability.

Particularly, the aluminum alloy of the present invention contains a much larger amount of Mg than a conventional Al—Si alloy, and more Mg than an Al—Mg alloy. The content of Mg according to the present invention is technically meaningful in that it is a composition enabling fabrication of a lightweight product, without decreasing corrosion resistance and workability. Owing to this feature, the aluminum alloy for die casting according to the present invention may be applied to parts of an electronic or communication device, particularly a portable product, which requires both light weight and high corrosion resistance.

The Si component acts to enhance moldability by increasing the fluidity of the aluminum alloy, and increase strength. The content of Si in the aluminum alloy for die casting according to the present invention is added preferably at 4 to 6% by weight with respect to the total weight of the aluminum alloy. If the content of Si is less than 4% by weight, the effect of adding Si is negligibly slight, whereas if the content of Si is greater than 6% by weight, a thermal expansion coefficient and an elongation percentage may be decreased, and the surface of the aluminum alloy may be stained.

In addition, the aluminum alloy for die casting according to the present invention contains 0.4 to 0.8% by weight of Fe. The Fe component functions to decrease the stickiness and corrosion of a die-casting mold. If the content of Fe is less than 0.4% by weight with respect to the total weight of the aluminum alloy, deformation of a die-cast product is difficult, whereas if the content of Fe is greater than 0.8% by weight, the corrosion resistance of the aluminum alloy may be decreased.

Further, the aluminum alloy for die casting according to the present invention contains 0.2 to 0.5% by weight of Mn. The Mn component enhances the mechanical properties of the aluminum alloy through solid solution hardening and dispersion of fine precipitates by precipitating a Mn-Al6 phase in the alloy. If the content of Mn is less than 0.2% by weight with respect to the total weight of the aluminum alloy, improvement of the mechanical properties is slight, whereas the content of Mn is greater than 0.5% by weight, Mn may decrease workability along with Mg in view of stickiness.

Further, the aluminum alloy for die casting according to the present invention contains 0.01 to 0.1% by weight of Cu. The Cu component increases the strength and hardness of the aluminum alloy. If the content of Cu is less than 0.01% by weight with respect to the total weight of the aluminum alloy, improvement of the mechanical properties is slight, whereas the content of Cu is greater than 0.1% by weight, the corrosion resistance and the elongation percentage may be decreased.

As the Ti component is added to the aluminum alloy, it acts to refine crystalline grains. The Ti component is added preferably at 0.05 to 0.15% by weight with respect to the total weight of the aluminum alloy for die casting according to the present invention. If the content of Ti is less than 0.05% by weight, the effect of refining crystalline grains may not be achieved, whereas if the content of Ti is greater than 0.15% by weight, the elongation percentage is decreased.

Preferably, the afore-described Al, Si, Fe, Cu, and Ti have 99% purity.

Selectively, the aluminum alloy may further contain at least one selected from a group consisting of Be and Co, at 0.001 to 0.01% by weight.

The Be component acts to refine crystalline grains. If Be is added to an alloy with a large content of Mg as in the present invention, Be may slow oxidation but is very expensive. When added, the Co component may act to increase the mechanical strength of the aluminum alloy and prevent sand burning of the mold.

In another aspect, the present invention provides a method for fabricating a part of a communication device with improved corrosion resistance, including producing an ingot containing 6 to 8.5% by weight of magnesium (Mg), 4 to 6% by weight of silicon (Si), 0.4 to 0.8% by weight of iron (Fe), 0.2 to 0.5% by weight of manganese (Mn), 0.01 to 0.1% by weight of copper (Cu), 0.05 to 0.15% by weight of titanium (Ti), and remaining aluminum (Al), melting the ingot into a molten metal, and fabricating a molded product with the molten metal, using a die-casting mold.

Figure 3:
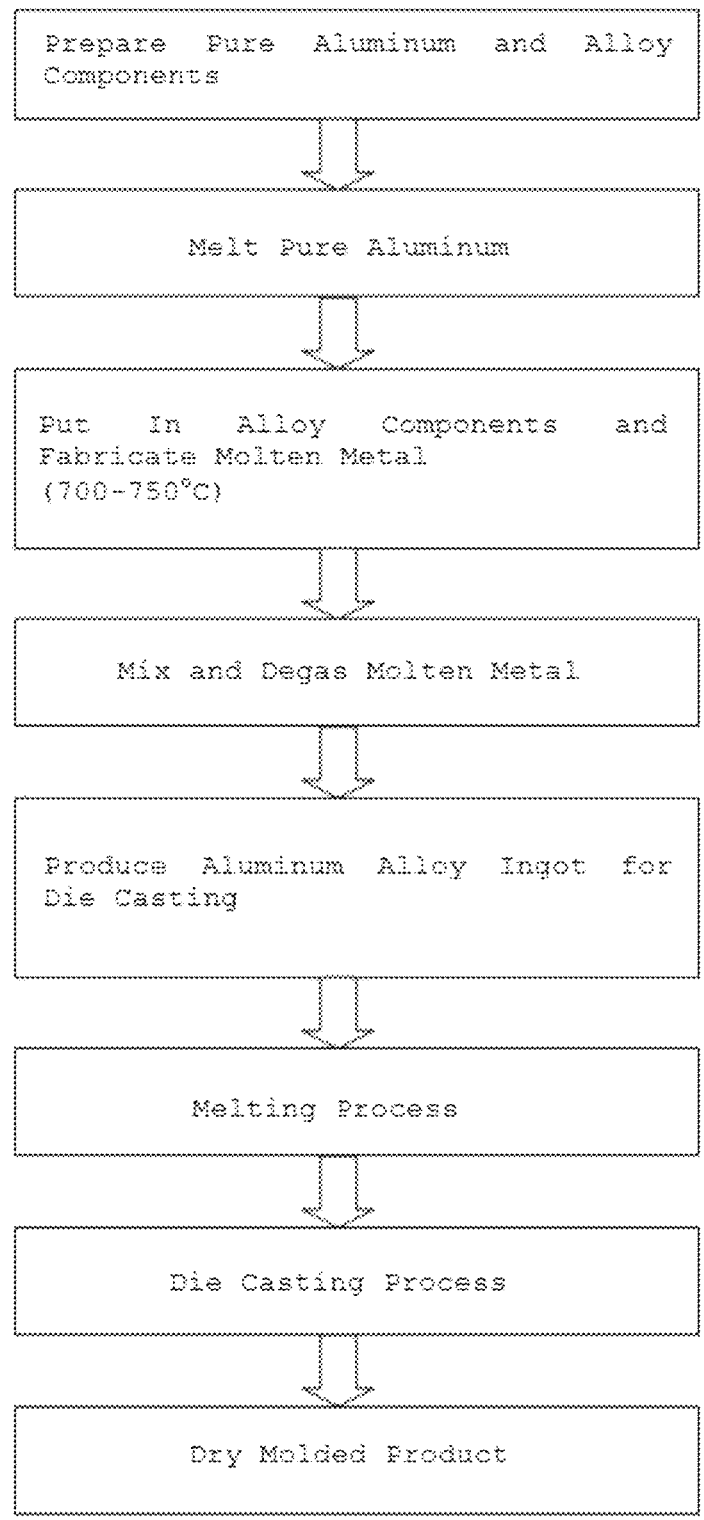
FIG. 3 is a flowchart illustrating an overall procedure of fabricating an aluminum alloy for die casting, and fabricating a molded product using the aluminum alloy according to the present invention.

The aluminum alloy for die casting according to the present invention may be fabricated according to a general alloy fabrication method. For example, the aluminum alloy may be fabricated by melting pure Al in an electric furnace, melting other pre-fabricated alloy components in the molten pure Al, mixing and degassing a molten metal of the electric furnace, and removing an aluminum alloy ingot for die casting from the electric furnace. FIG. 3 is a flowchart illustrating a procedure for fabricating an aluminum alloy ingot for die casting, and an overall procedure for fabricating a molded product by re-melting the ingot, introducing the molten ingot into a die casting device, injecting the introduced molten material, and cooling the injected molten material according to the present invention.

The melting step may be performed at a temperature of 700 to 780° C., and the re-melting step may be performed at or below a temperature of 680 to 700° C. Further, the injection may be performed at a rate of 0.4 to 1.2 m/s and a pressure of 100 to 120 kg/cm² after preheating a mold provided in the die casting device at 150° C.

Because the aluminum alloy for die casting according to the present invention does not stick to a mold, has good workability, has similar properties to or better properties than a conventional aluminum alloy, is lightweight, and has excellent corrosion resistance, the aluminum alloy is applicable in fabrication of a part of an electronic or communication device requiring both lightweight and high corrosion resistance for products. Preferably, the part of the communication device may be a frequency filter. The frequency filter is a transmission and reception equipment for a mobile communication base station, for filtering a predetermined frequency band. For the frequency filter, low insertion loss and high attenuation are required, and a small size and a light weight is important through size and weight reduction. Thus, the aluminum alloy for die casting according to the present invention may satisfy these requirements.

Now, a detailed description will be given of the present invention with reference to specific embodiments of the present invention. However, the embodiments are mere examples used to describe the present invention, not limiting the scope of the present invention.

Embodiment 1: Fabrication of Aluminum Alloy for Die Casting and Test of Properties of the Aluminum Alloy To fabricate an aluminum alloy with excellent corrosion resistance, for die casting according to the present invention, an aluminum alloy ingot was produced by preparing pure Al and other alloy elements so that 7 kinds of components including Mg, Si, Fe, Mn, Cu, Ti, and Al may have alloy compositions illustrated in [Table 1], melting the elements into a molten metal at a temperature of about 740° C. in a furnace, mixing and degassing the molten metal, and stabilizing the degassed molten metal.

After the ingot was re-melted in a holding furnace and the molten metal was kept at 690° C., the molten metal was put, injected, and cooled in a mold by means of a die casting device, thereby producing a specimen for salt water testing as illustrated in FIG. 1A. When the specimen was fabricated, it was not anodized. That is, FIG. 1A illustrates pictures of surface changes without any surface processing.

Meanwhile, alloy products of ALDC3 and ALDC 12 were prepared as comparison examples. [Table 2] lists specific compositions of ALDC12 used in the comparison embodiments.

TABLE 1

| Alloy (wt. %) | Mg | Si | Fe | Mn | Cu | Ti | Al |
|---|---|---|---|---|---|---|---|
| Embodiment 1-1 | 7.82 | 4.60 | 0.57 | 0.324 | 0.036 | 0.096 | Remainder |
| Embodiment 1-2 | 7.88 | 4.50 | 0.59 | 0.341 | 0.079 | 0.093 | Remainder |
| Embodiment 1-3 | 7.91 | 4.60 | 0.58 | 0.304 | 0.035 | 0.095 | Remainder |

TABLE 2

| | Composition (wt. %) | | | | | | | | | | |
|---|---|---|---|---|---|---|---|---|---|---|---|
| | Al | Cu | Fe | Mg | Mn | Ni | Si | Sn | Zn | Pb | Ti |
| ALDC 12.1 [Ref. Value] | Remainder | 1.5 to 3.5 | 0.6 to 1.0 | <0.3 | <0.5 | <0.5 | 9.6 to 12.0 | <0.2 | <1.0 | <0.2 | <0.3 |
| ALDC 12.1 [Real Value] | 85.4 | 1.76 | 0.889 | 0.167 | 0.194 | 0.033 | 10.7 | 0.015 | 0.704 | 0.039 | 0.022 |

To find out the mechanical properties of the specimens, the tensile strengths of the specimens were measured according to KS B 0802, using a tensile tester (SHIMADZU, AG-1). The specimen of the present invention and the specimen of the comparison embodiment (ALDC12.1) have similar high strengths, 101 MPa and 116 MPa, respectively. Meanwhile, as measured according to ASTM E 1461 by a thermal expansion tester to find out thermal characteristics, the heat conductivity of the specimen according to the present invention was 99 W/m-K, slightly higher than a reference value of the general ALDC12.1, 96.2 W/m-K. As measured according to ASTM D 991 by a low resistance meter (Mitsubishi, MCP-T610) to find out electrical characteristics, the electric resistivity of the specimen according to the present invention was $1.07 \times 10^{-5}$ ohm-cm, higher than a reference value of the general ALDC12.1, $0.75 \times 10^{-5}$ ohm-cm.

As noted from the test, the aluminum alloy for die casting according to the present invention exhibits similar properties to or better properties than those of the conventional aluminum alloys.

Embodiment 2: Salt Water Test

To find out the corrosion resistances of the aluminum alloy specimen and the comparison examples of ALDC3 and ALDC12 aluminum alloys, which were fabricated with the compositions of Embodiment 1, a salt water test was performed using a salt water tester. The salt water spray test was performed according to the ASTM B117 regulations, a 5 wt % NaCl solution was used, and salt water was sprayed continuously in the salt water tester kept constant at 35° C., and surface corrosion behaviors were measured, focusing on pin holes and swelling after 120 hours, 264 hours, 576 hours, and 774 hours (refer to FIGS. 1A, 1B, and 1C). In addition, surface corrosions were observed with the naked eye and their comparison results were listed in [Table 3].

TABLE 3

| Alloy | After 120 h | After 264 h | After 576 h | After 774 h |
|---|---|---|---|---|
| Present Invention | Normal-no corrosion | Normal-no corrosion | Normal-no corrosion | Normal-no corrosion |
| ALDC3 | Corrosion start | Corrosion progress | Corrosion progress | Corrosion progress |
| ALDC12 | Corrosion progress | Much corrosion progress-severe material roughness | Severe corrosion-severe material denting | Severe corrosion |

Figure 1B:
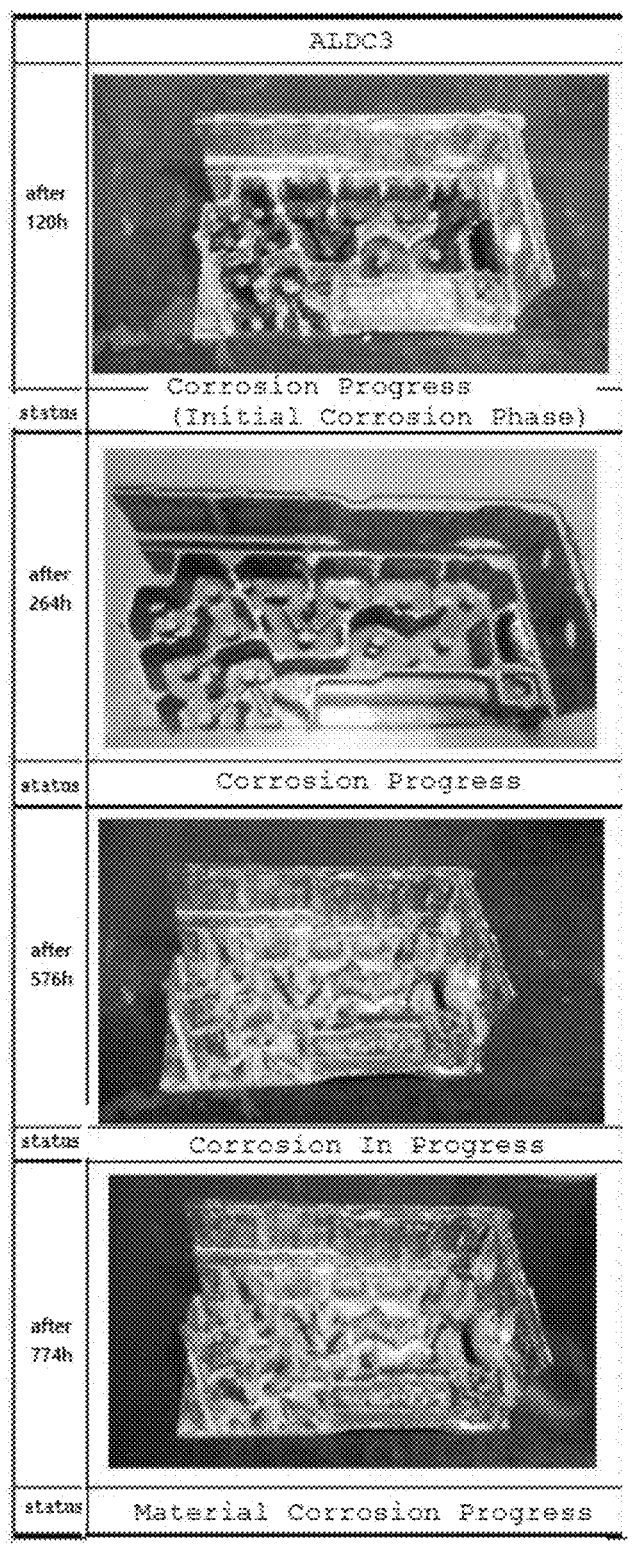
FIG. 1B illustrates pictures of surface changes of a conventional aluminum alloy for die casting, ALDC3, measured after 120 hours, 264 hours, 576 hours, and 774 hours with no surface processing under the conditions of a salt water spray test.
Figure 1C:
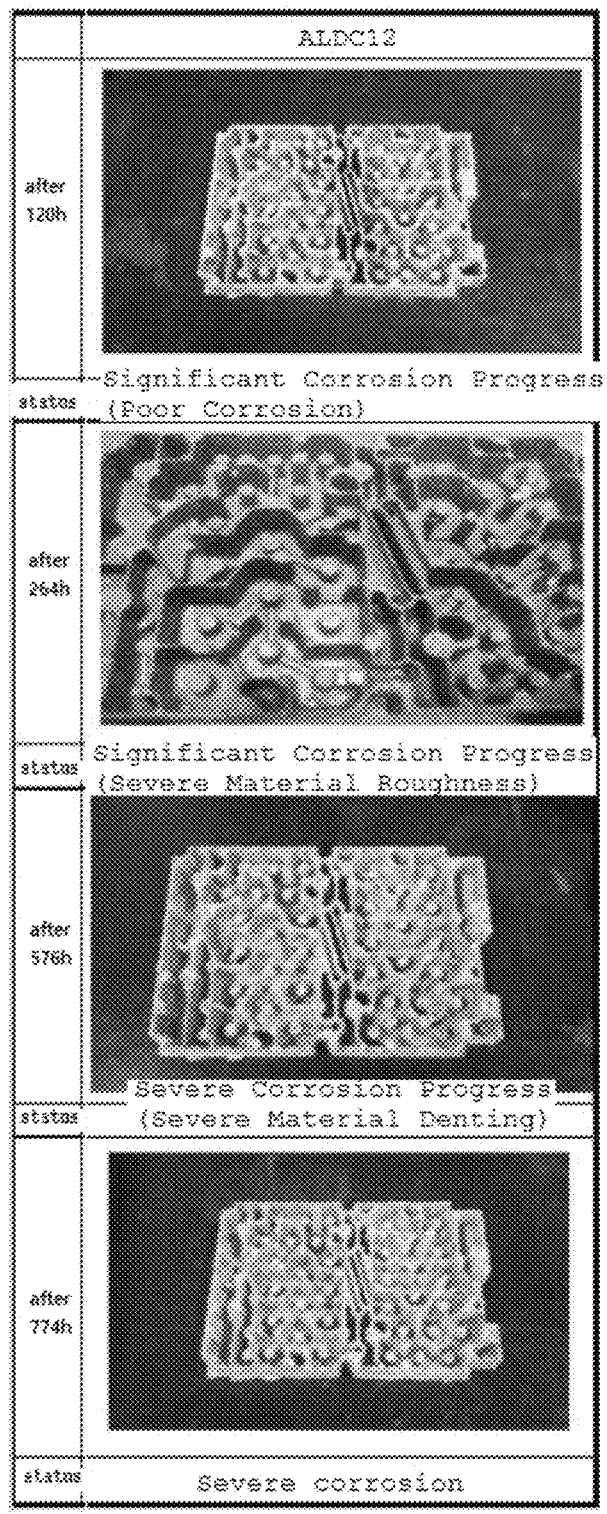
FIG. 1C illustrates pictures of surface changes of a conventional aluminum alloy for die casting, ALDC12, measured after 120 hours, 264 hours, 576 hours, and 774 hours with no surface processing under the conditions of a salt water spray test.

The results of FIGS. 1A, 1B, and 1C and [Table 3] reveal that the aluminum alloy for die casting according to the present invention experienced slight surface discoloration without any corrosion even after 750 hours, whereas the conventional aluminum alloy of ALDC3 for die casting started to be corroded after 120 hours, and the conventional aluminum alloy of ALDC12 for die casting was significantly corroded after 120 hours, the corrosion becoming severe with passage of time.

Accordingly, it was confirmed that the aluminum ally for die casting according to the present invention was lightweight and had good workability and improved corrosion resistance, while maintaining its own properties, compared to the conventional aluminum alloys.

Embodiment 3: Test of Corrosion Resistance Against Gas

Figure 2:
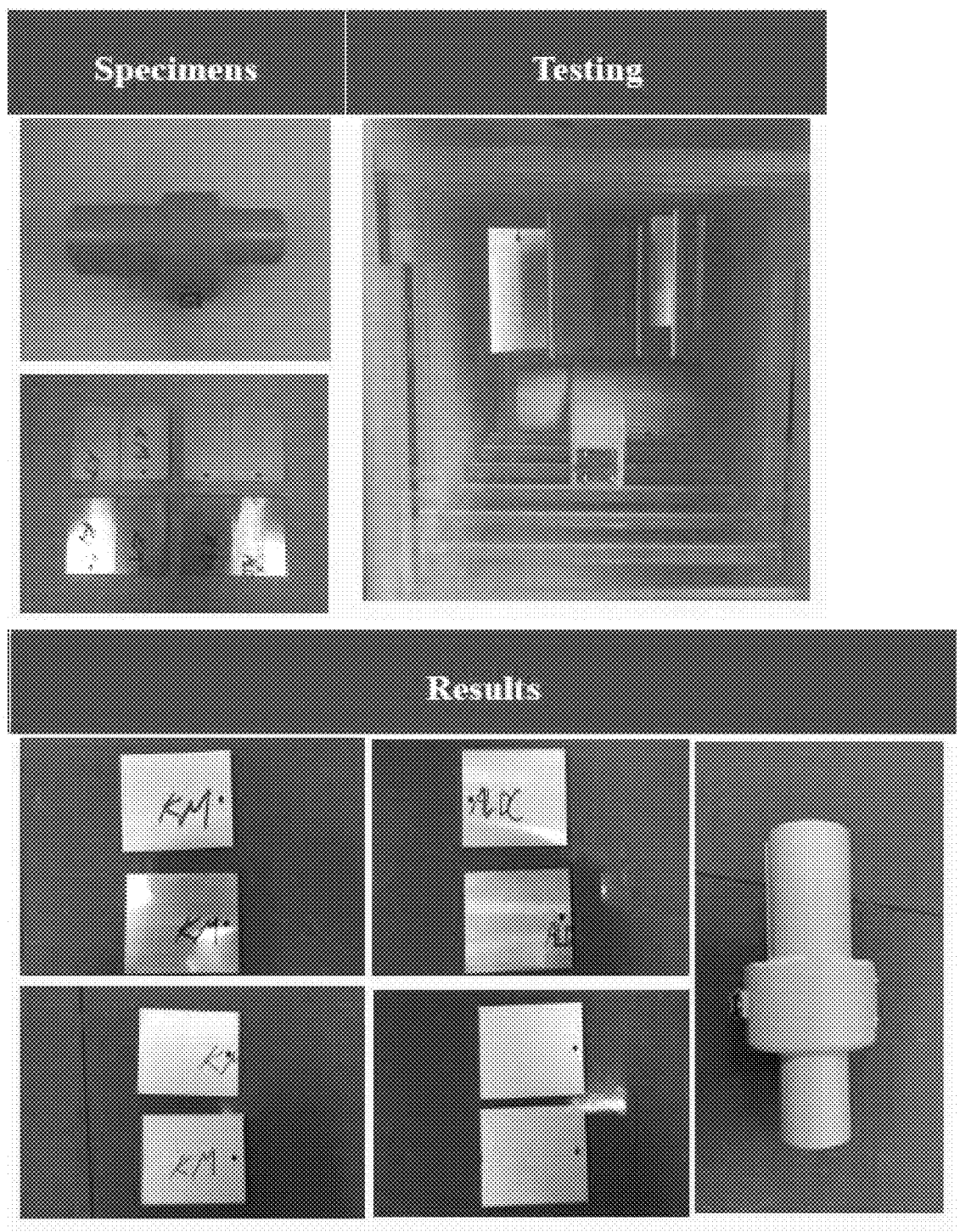
FIG. 2 illustrates test results regarding the corrosion resistance against gas of an aluminum alloy for die casting according to the present invention (upper left pictures: specimens, upper right picture: corrosion test chamber (Weiss, WK11-340-40), and lower pictures: test results).

To find out the corrosion resistance against gas of the aluminum alloy for die casting according to the present invention, a test was performed in a corrosion testing chamber (Weiss, WK11-340-40) under the test conditions of 35° C., RH 75%, and 240 hours in compliance to IEC 60068-2-60 and Method 3 as a test standard. As illustrated in FIG. 2, the aluminum alloy was proved to be good in corrosion resistance against gas, as a result of the test.

The scope of the present invention is limited only by the appended claims, and those skilled in the art can change or modify the present invention in various manners. Accordingly, as far as these modifications and variations are apparent to those skilled in the art, they fall within the protected scope of the present invention.

What is claimed is:

1. An aluminum alloy, comprising 7.82 to 7.91% by weight of magnesium (Mg), 4.5 to 4.6% by weight of silicon (Si), 0.4 to 0.8% by weight of iron (Fe), 0.2 to 0.5% by weight of manganese (Mn), 0.01 to 0.1% by weight of copper (Cu), 0.05 to 0.15% by weight of titanium (Ti), and remaining aluminum (Al).

2. The aluminum alloy according to claim 1, further comprising at least one selected from the group consisting of beryllium (Be) and cobalt (Co) at 0.001 to 0.01% by weight.

3. The aluminum alloy according to claim 1, wherein the aluminum alloy contains incidental impurities below 0.01% by weight.

* * * * *